(12) United States Patent
Liang et al.

(10) Patent No.: US 11,081,559 B1
(45) Date of Patent: Aug. 3, 2021

(54) BACKSIDE CONTACT OF A SEMICONDUCTOR DEVICE

(71) Applicant: QUALCOMM Incorporated, San Diego, CA (US)

(72) Inventors: Qingqing Liang, San Diego, CA (US); Sivakumar Kumarasamy, San Diego, CA (US); George Pete Imthurn, San Diego, CA (US); Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/778,546

(22) Filed: Jan. 31, 2020

(51) Int. Cl.
*H01L 29/423* (2006.01)
*H01L 29/78* (2006.01)
*H01L 29/06* (2006.01)
*H01L 29/49* (2006.01)
*H01L 29/40* (2006.01)
*H01L 29/66* (2006.01)

(52) U.S. Cl.
CPC .... *H01L 29/42356* (2013.01); *H01L 29/0665* (2013.01); *H01L 29/401* (2013.01); *H01L 29/4916* (2013.01); *H01L 29/66795* (2013.01); *H01L 29/785* (2013.01); *H01L 2029/7858* (2013.01)

(58) Field of Classification Search
CPC .......... H01L 29/42356; H01L 29/0665; H01L 2029/7858
See application file for complete search history.

(56) References Cited

U.S. PATENT DOCUMENTS 6,838,332 B1 * 1/2005 Sanchez ............ H01L 21/76898
438/239
2020/0294998 A1 * 9/2020 Lilak ................. H01L 29/78696

* cited by examiner

*Primary Examiner* — Changhyun Yi
(74) *Attorney, Agent, or Firm* — Patterson & Sheridan, L.L.P.

(57) ABSTRACT

Certain aspects of the present disclosure generally relate to a semiconductor device having a backside gate contact. An example semiconductor device generally includes a transistor disposed above a substrate, wherein the transistor comprises a gate region, a channel region, a source region, and a drain region and wherein the gate region is disposed adjacent to the channel region. The semiconductor device further includes a backside gate contact that is electrically coupled to a bottom surface of the gate region and that extends below a bottom surface of the substrate.

20 Claims, 13 Drawing Sheets

Top-Down View

US 11,081,559 B1

BACKSIDE CONTACT OF A SEMICONDUCTOR DEVICE

BACKGROUND

Field of the Disclosure

Certain aspects of the present disclosure generally relate to electronic circuits and, more particularly, to a semiconductor device having a backside contact.

Description of Related Art

As electronic devices are getting smaller and faster, the demand for integrated circuits (ICs) with higher I/O count, faster data processing rate, and/or better signal integrity greatly increases. The ICs may include various conductors (e.g., conductive contacts and/or metal layers), which are often formed during a back-end-of-line (BEOL) fabrication process. The conductors facilitate electrical wiring to various electrical components including transistors, amplifiers, inverters, control logic, memory, power management circuits, buffers, filters, resonators, capacitors, inductors, resistors, etc.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include improved gate contacts for a semiconductor device.

Certain aspects of the present disclosure provide a semiconductor device. The semiconductor device generally includes a transistor disposed above a substrate, wherein the transistor comprises a gate region, a channel region, a source region, and a drain region, wherein the gate region is disposed adjacent to the channel region. The semiconductor device further includes a backside gate contact that is electrically coupled to a bottom surface of the gate region and that extends below a bottom surface of the substrate.

Certain aspects of the present disclosure provide a method of fabricating a semiconductor device. The method generally includes forming a transistor above a substrate, wherein the transistor comprises a gate region, a channel region, a source region, and a drain region, wherein the gate region is adjacent to the channel region. The method further includes forming a backside gate contact that is electrically coupled to a bottom surface of the gate region and that extends below a bottom surface of the substrate.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure generally relate to a semiconductor device having backside contacts and various methods for fabricating such a semiconductor device.

In certain cases, a backside contact may be used to provide electrical routing below an active electrical device, such as a transistor. For example, the backside contact may provide a conductive contact coupled between metal layers disposed above and below a substrate and/or a conductive contact coupled between a source/drain region and a metal layer disposed below the substrate. In certain cases, layer-transfer technologies may allow the formation of backside contacts that are coupled directly to one or more diffusion regions, such as a source or drain region of a transistor. The process of backside silicidation may increase the complexity of the fabrication process, resulting in yield loss risks. The silicidation process may also produce a higher thermal budget, which may have adverse effects on the device performance, back-end-of-line (BEOL) integrity of frontside contacts, and, in radio frequency (RF) applications, possible loss of RF performance, such as harmonics or distortion products (e.g., the input intercept point (IIP)).

Aspects of the present disclosure provide a semiconductor device having a backside contact that is coupled directly to a gate region, such as a polycrystalline silicon layer of the gate region. As described herein with respect to the backside gate contact, the direct contact to the gate region may improve device design space/options and electrical routing approaches of the semiconductor device. For example, the backside gate contact may enable improved design space and options by reducing the electrical routing to the gates of transistors via the backside of the semiconductor device. As an example, the backside gate contacts may enable electrical routing options on the frontside where routing would have been used to connect to the gate contacts. In certain cases, the backside gate contacts may facilitate electrical routing to decoupling capacitors or other passive components attached on the landside of the semiconductor device. Such electrical routing may enable improved performance of the semiconductor device, for example, by reducing parasitic losses encountered with electrical routing on the frontside. In certain aspects, layer transfer processes may be performed to couple the various backside contacts and metal layers disposed below an active electrical device, such as a transistor.

Example Backside Contact

Figure 1A:
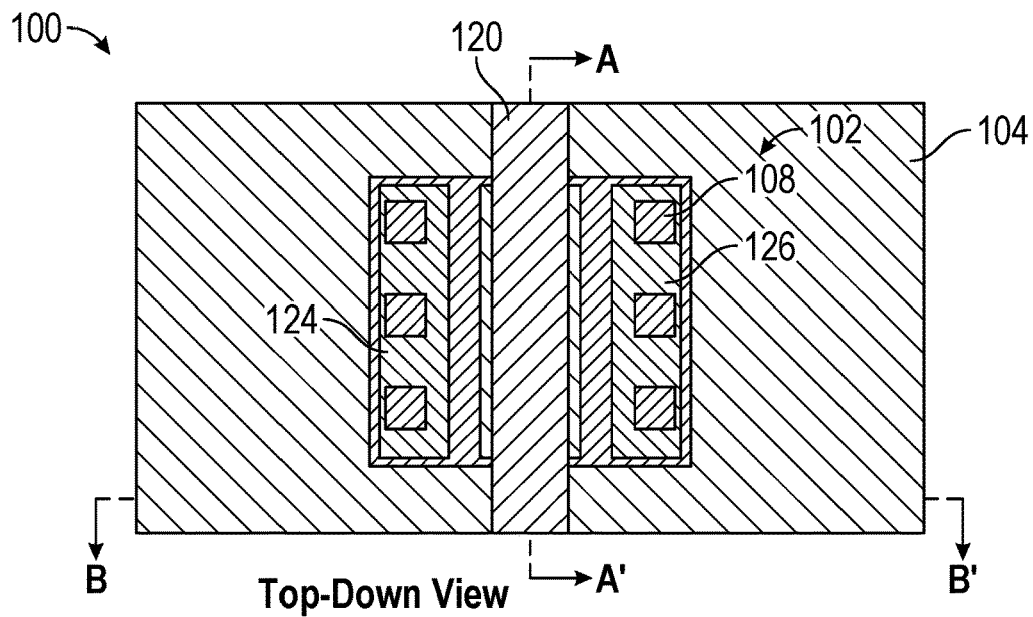
FIG. 1A is a top view of an example semiconductor device having a backside gate contact, in accordance with certain aspects of the present disclosure.
Figure 1B:
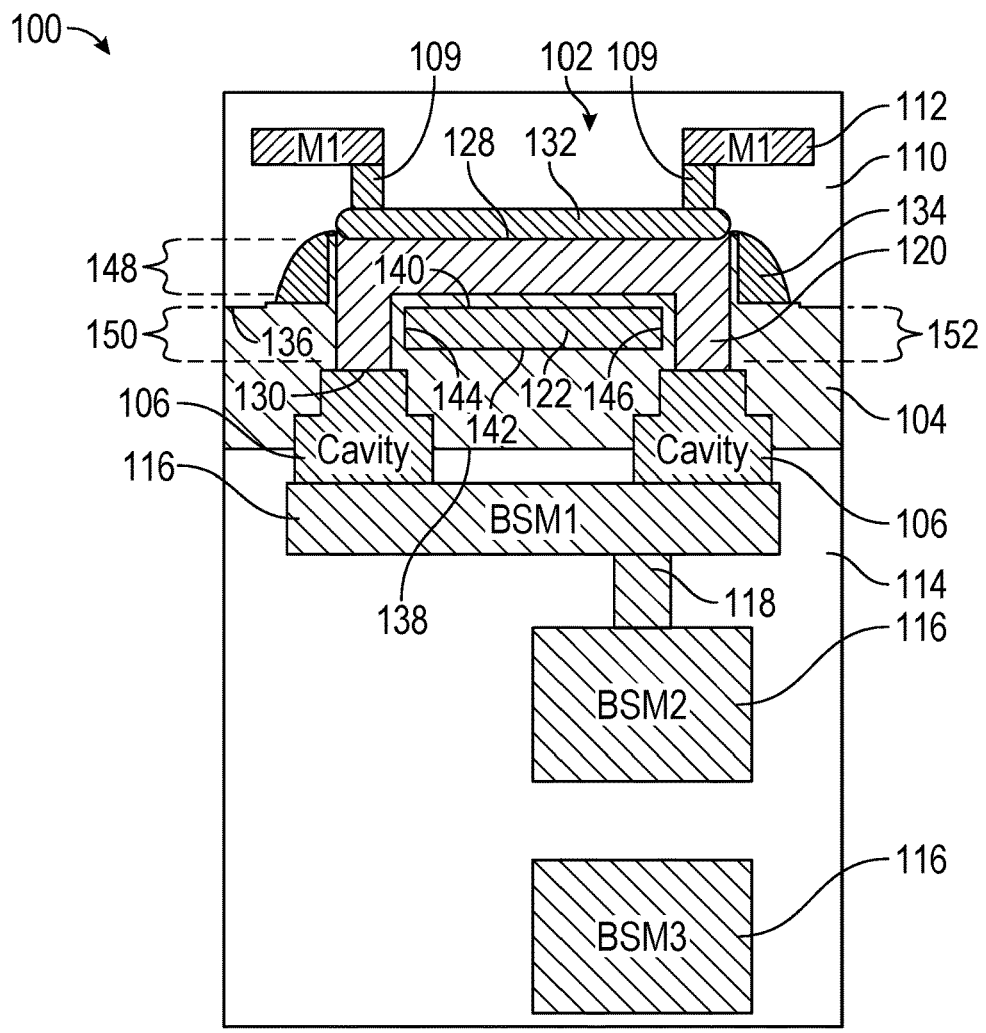
FIG. 1B is a cross-sectional view taken along line segment AA' of FIG. 1A, in accordance with certain aspects of the present disclosure.

FIGS. 1A and 1B illustrate a top view and a cross-sectional view, respectively, of an example semiconductor device 100 that has a backside gate contact coupled to a gate region of a transistor, in accordance with certain aspects of the present disclosure. FIG. 1B illustrates the semiconductor device 100 across the cross-section AA' as depicted in FIG. 1A. As shown in FIGS. 1A and 1B, the semiconductor device 100 may include a transistor 102, a substrate 104, and one or more backside gate contacts 106 (shown in FIG. 1B). In certain aspects, the semiconductor device 100 may further include frontside contacts 108 and 109, frontside dielectric layers 110, frontside conductive vias (not shown), frontside conductive traces 112 (e.g., metal layer one (M1)), backside dielectric layers 114, backside conductive traces 116 (e.g., first, second, and third backside metal layers labeled "BSM1," "BSM2," "BSM3"), and backside conductive vias 118.

In aspects, the transistor 102 may be formed during a front-end-of-line (FEOL) fabrication process. The frontside aspects (including the frontside contacts 108 and 109, frontside dielectric layers 110, and frontside conductive traces 112) may be formed during the BEOL fabrication process. In certain aspects, the backside aspects (including the backside dielectric layers 114, backside conductive traces 116, and backside conductive vias 118) may be formed during a layer transfer process of the BEOL fabrication process.

The transistor 102 is disposed above the substrate 104. The transistor 102 may include a metal-oxide-semiconductor field-effect transistor (MOSFET), and the MOSFET may include a finFET and/or a GAA FET. In the example depicted in FIGS. 1A and 1B, the transistor 102 is a finFET.

The transistor 102 may include a gate region 120, a channel region 122, a source region 124, and a drain region 126. As the transistor 102 is a finFET, the channel region 122 may include one or more semiconductor fin structures. In certain aspects, the semiconductor fin structures may extend above the substrate 104. In certain aspects, the channel region 122 may include nanosheets and/or nanowires (not shown), for example, in cases where the transistor 102 is a GAA FET.

In aspects, the gate region 120 may include a conductive layer disposed adjacent (e.g., above) at least one dielectric layer (not shown). The conductive layer may include one or more layers of electrically conductive materials such as polycrystalline silicon (polysilicon) or various work function metals including titanium nitride (TiN), aluminum (Al), tantalum nitride (TaN), titanium aluminide (TiAl), tungsten (W), etc. In aspects, the dielectric layer may include a dielectric material (e.g., hafnium dioxide ($HfO_2$), zirconium dioxide ($ZrO_2$), and/or titanium dioxide ($TiO_2$)) with a dielectric constant ($\kappa$) higher than silicon dioxide ($SiO_2$) (e.g., $\kappa=3.9$). In some aspects, the dielectric material may be referred to as a high-$\kappa$ dielectric.

In aspects, the gate region 120 includes an upper surface 128 and a bottom surface 130. The upper surface 128 of the gate region 120 may be disposed above the substrate 104 and coupled to the frontside contacts 109, and the bottom surface 130 of the gate region 120 may be embedded in the substrate 104 and coupled to the backside gate contacts 106. That is, the backside gate contacts 106 may engage the bottom surface 130 of the gate region 120.

In aspects, the gate region 120 wraps around a portion of an upper surface 140, a portion of a first lateral surface 144, and a portion of a second lateral surface 146 of the channel region 122. As shown, the channel region 122 may also have a bottom surface 142 disposed below the upper surface 140. In certain aspects, the gate region 120 comprises a first portion 148 disposed above the portion of the upper surface 140 of the channel region 122, a second portion 150 extending orthogonally from the first portion 148 and disposed adjacent to the portion of the first lateral surface 144 of the channel region 122, and a third portion 152 extending orthogonally from the first portion 148 and disposed adjacent to the portion of the second lateral surface 146 of the channel region 122. The backside gate contacts 106 may be electrically coupled to a bottom surface 130 of the second and/or third portions 150, 152 of the gate region 120.

In aspects, a conductive layer 132 (e.g., tungsten (W)) may be disposed above the gate region 120. The conductive layer 132 may be electrically coupled between the gate region 120 and the frontside contacts 109.

In aspects, the gate region 120 may be disposed between gate spacers 134. In certain aspects, the gate spacers 134 may serve as a mold for forming the gate region 120.

As shown, the gate region 120 is disposed adjacent to the channel region 122. For example, the gate region 120 may surround a portion of the semiconductor fin structures of the channel region 122. In certain cases, for example, where the transistor 102 is a GAA FET, the gate region 120 may wrap around the channel region 122, as further described herein with respect to FIGS. 4A and 4B.

Referring to FIG. 1A, the source and drain regions 124, 126 may be adjacent to the gate region 120, such that the gate region 120 is disposed between the source and drain regions 124, 126. In certain aspects, the transistor 102 may be configured as an n-type metal-oxide-semiconductor (NMOS) transistor. For example, the source region 124 and drain region 126 of the transistor 102 may be n+ doped semiconductors. In other aspects, the transistor 102 may be a p-type MOS (PMOS) transistor. For example, the source region 124 and drain region 126 of the transistor 102 may be p+ doped semiconductors.

The substrate 104 may be, for example, a portion of a semiconductor wafer including a silicon wafer. In certain aspects, the substrate 104 may be a silicon-on-insulator (SOI) substrate having an electrical insulator layer disposed between layers of silicon, for example, as further described herein with respect to FIG. 6. In aspects, the insulator layer may include a dielectric region, which may be composed of any of various suitable electrically insulating materials, such as silicon dioxide ($SiO_2$).

The substrate 104 may have an upper surface 136 and a bottom surface 138. The frontside dielectric layers 110 may be disposed above the upper surface 136 of the substrate 104, and the backside dielectric layers 114 may be disposed below the bottom surface 138 of the substrate 104.

The backside gate contacts 106 may be electrically conductive local interconnects disposed below the transistor 102 and electrically coupled to the gate region 120 of the transistor 102. The backside gate contacts 106 may enable improved electrical routing approaches for the semiconductor device 100. For example, the backside gate contacts 106 may facilitate electrical routing to decoupling capacitors or other passive components attached on the landside (or die-side) of the semiconductor device 100. In certain cases, the backside gate contacts 106 may enable electrical routing to a power distribution network that enters via the landside (or die-side) of the semiconductor device 100. In certain cases, the backside gate contacts 106 may improve the performance of the semiconductor device, for example, by reducing parasitic losses encountered with electrical routing on the frontside.

The frontside contacts 108 and 109 may be electrically conductive interconnects disposed above the transistor 102 and electrically coupled to the transistor 102. For example, as shown in FIG. 1A, the source and/or drain regions 124, 126 of the transistor 102 may be electrically coupled to the frontside contacts 108. As shown in FIG. 1B, the gate region 120 may be electrically coupled to the frontside contacts 109.

Figure 2:
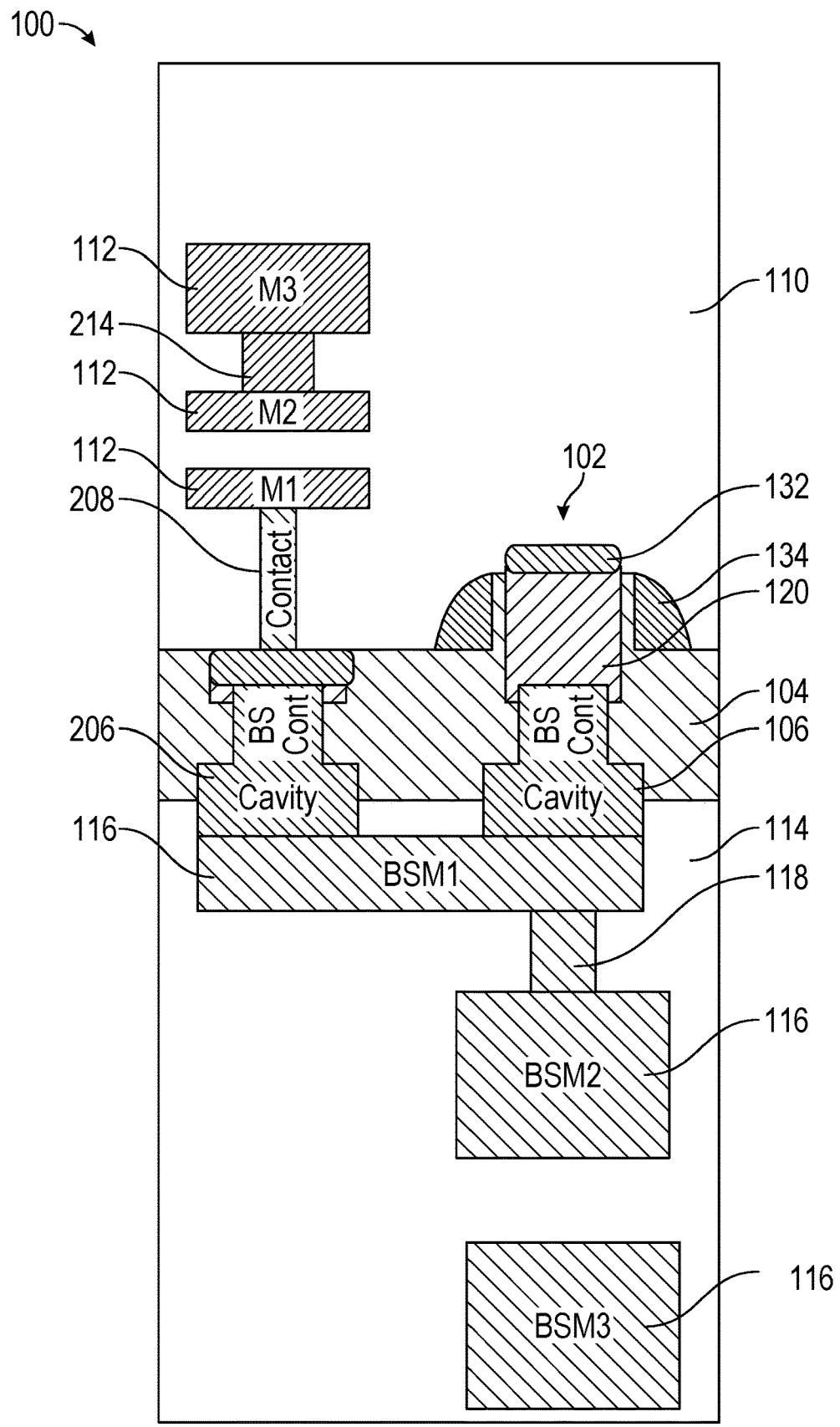
FIG. 2 is a cross-sectional view taken along line segment BB' of FIG. 1A illustrating the fan-out in different metal layers, in accordance with certain aspects of the present disclosure.

The frontside conductive traces 112 are disposed above the transistor 102. The frontside conductive traces 112 may be electrically coupled to the transistor 102 via the frontside contacts 109. In aspects, additional layers of frontside conductive traces (not shown) may be disposed above the transistor 102, for example, as depicted in FIG. 2.

The frontside dielectric layers 110 are disposed above the transistor 102 and/or the substrate 104. The frontside contacts 108 and 109 and frontside conductive traces 112 may be embedded in the frontside dielectric layers 110. In aspects, the frontside dielectric layers 110 may comprise an oxide, such as silicon dioxide.

The backside conductive traces 116 are disposed below the substrate 104. The backside conductive traces 116 may be electrically coupled to the transistor 102 via the backside gate contacts 106. The backside conductive vias 118 are disposed between layers of the backside conductive traces 116 and below the substrate 104. The backside conductive vias 118 may include an electrically conductive material.

The backside dielectric layers 114 are disposed below the substrate 104. The backside conductive traces 116 and backside conductive vias 118 may be embedded in the backside dielectric layers 114. In aspects, the backside dielectric layers 114 may comprise an oxide, such as silicon dioxide.

The various conductors (such as the frontside and backside traces, vias, and contacts) provide electrical routing between the transistor 102 and other electrical components (not shown), including, for example, other transistors, capacitors, inductors, resistors, an integrated passive device, a power management IC (PMIC), a memory chip, etc.

In aspects, the semiconductor device 100 may be a flip-chip ball grid array (FC-BGA) integrated circuit having multiple solder bumps (not shown) electrically coupled to under-bump conductive pads (not shown). In aspects, the under-bump conductive pads may be disposed above the various frontside conductors or below the various backside conductors. In certain cases, the semiconductor device 100 may have conductive pillars (e.g., copper (Cu) pillars) that electrically couple the semiconductor device 100 to a package substrate, an interposer, or a circuit board, for example.

In certain aspects, the backside gate contacts 106 may directly engage the channel region 122. For example, the backside gate contacts 106 may engage the bottom surface 142 of the channel region 122. In such a case, the backside gate contact 106 may facilitate forming a bipolar junction transistor (BJT).

FIG. 2 illustrates the semiconductor device 100 across the cross-section BB' as depicted in FIG. 1A. As shown in FIG. 2, the backside gate contact 106 is electrically coupled to the gate region 120 and extends below the substrate 104.

In certain aspects, the backside conductive traces 116 may be electrically coupled to other backside contacts, such as a backside contact 206. Referring to FIG. 2, the backside contact 206 may be laterally spaced from the backside gate contact 106 and extend below the substrate 104. In aspects, the backside contact 206 may be an electrically conductive local interconnect that intersects the substrate 104. The backside contact 206 may be electrically coupled to a frontside contact 208, which is disposed above the backside contact 206. The frontside contact 208 may be disposed above the substrate 104 and electrically coupled to the frontside conductive traces 112.

In this example, frontside conductive vias 214 are disposed between layers of the frontside conductive traces 112 and above the substrate 104.

Figure 3:
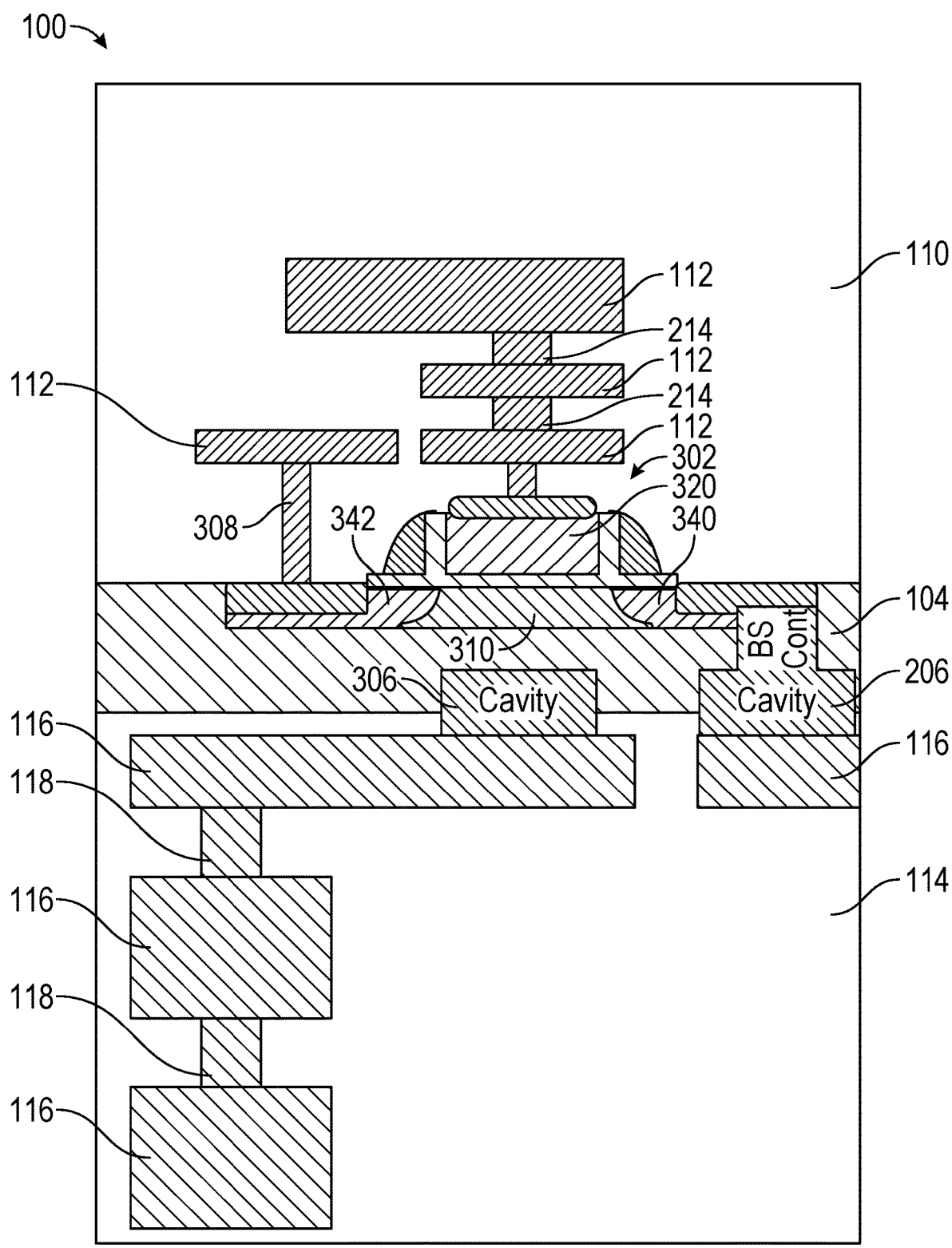
FIG. 3 illustrates another portion of the semiconductor device of FIG. 1A taken along a cross-section orthogonal to that of the cross-section depicted in FIG. 2, in accordance with certain aspects of the present disclosure.

In certain aspects, the backside contact 206 may be electrically coupled to a source or drain of the transistor 102 or of another transistor. For example, FIG. 3 illustrates another portion of the semiconductor device 100 across a cross-section orthogonal to that of the cross-section depicted in FIG. 2. Referring to FIG. 3, the backside contact 206 is electrically coupled to a source region 340 of a second transistor 302. The second transistor 302 includes a channel region 310, a gate region 320, the source region 340, and a drain region 342. The drain region 342 of the second transistor 302 may be electrically coupled to a frontside contact 308, which is disposed above the drain region 342. The frontside contact 308 may be electrically coupled to the frontside conductive traces 112. The second transistor 302 may function as an electrical switch between the backside contact 206 and the frontside contact 308.

In aspects, a backside gate contact 306 may be disposed below the channel region 310 of the second transistor 302 and extend below the substrate 104. A portion of the substrate may be disposed between the channel region 310 and the backside gate contact 306. In aspects, the backside gate contact 306 may serve as a gate terminal of the second transistor 302 disposed below the channel region 310.

Figure 4:
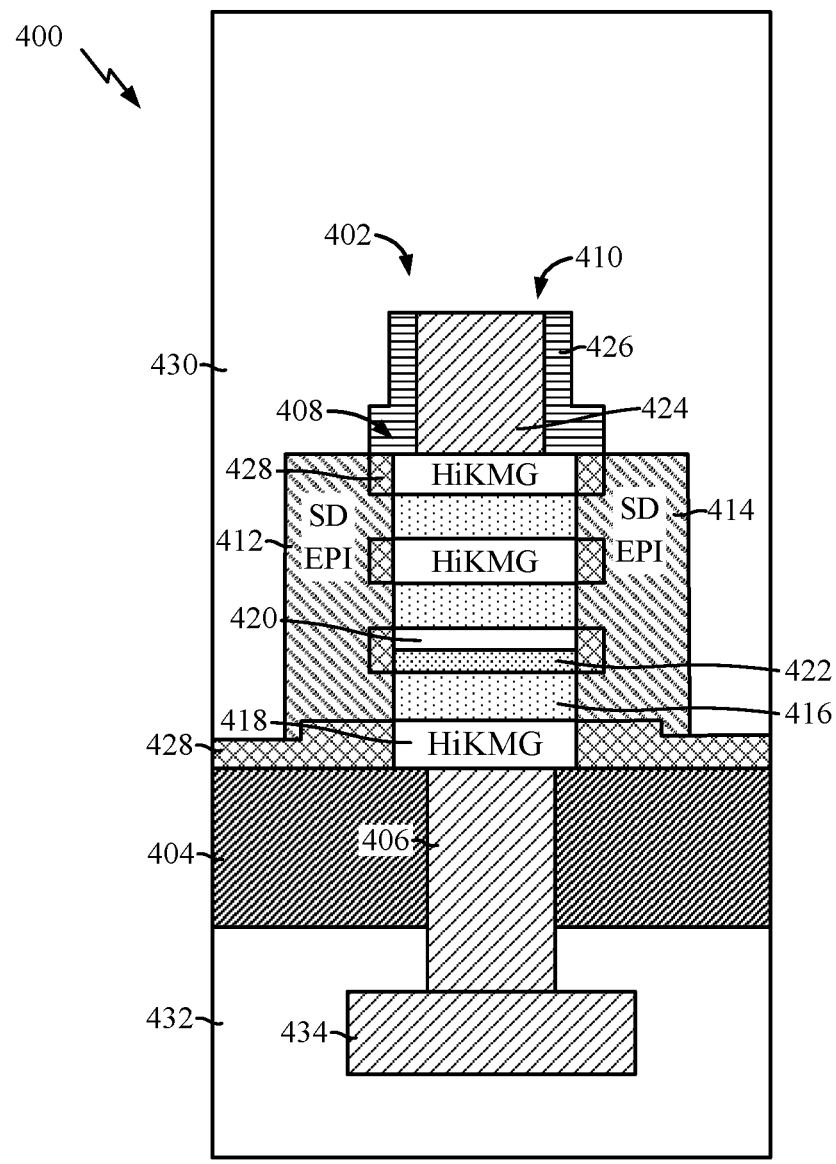
FIG. 4 illustrates a cross-sectional view of an example gate-all-around (GAA) transistor with a backside gate contact, in accordance with certain aspects of the present disclosure.

In certain aspects, a backside gate contact may be coupled to the gate region of a GAA transistor. For example, FIG. 4 illustrates an example of a semiconductor device 400 that has a backside gate contact coupled to a gate region of a GAA transistor, in accordance with certain aspects of the present disclosure. As shown, the semiconductor device 400 includes a GAA transistor 402, a substrate 404, and a backside gate contact 406.

In aspects, the GAA transistor 402 may be disposed above the substrate 404. The GAA transistor 402 may include a stack structure 408, a gate region 410, a source region 412, and a drain region 414. The stack structure 408 may include a plurality of channel layers 416 and a plurality of gate layers 418. In certain aspects, the stack structure 408 may be a stack of nanosheets, where each of the channel layers 416 is a separate nanosheet, surrounded or at least separated by the gate layers 418.

The channel layers 416 may be arranged in the stack structure 408 such that the channel layers 416 alternate with the gate layers 418. For example, each of the channel layers 416 may be disposed between two of the gate layers 418. In aspects, one of the gate layers 418 may be the topmost layer of the stack structure 408, and another one of the gate layers 418 may be the bottommost layer of the stack structure 408, as illustrated in FIG. 4.

The channel layers 416 may include a semiconductor material, such as silicon (Si) or silicon germanium (SiGe). In certain aspects, the semiconductor material of the channel layers 416 may be an n-type or p-type semiconductor material (e.g., via doping). In aspects, the channel layers 416 may have a height of 5 nanometers (nm) or less.

In aspects, each of the gate layers 418 may include a conductive layer 420 disposed adjacent (e.g., above) at least one dielectric layer 422. The conductive layer 420 may include one or more layers of electrically conductive materials such as polycrystalline silicon or various work function metals including titanium nitride (TiN), aluminum (Al), tantalum nitride (TaN), titanium aluminide (TiAl), tungsten (W), etc. In aspects, the dielectric layer 422 may include a dielectric material (e.g., hafnium dioxide ($HfO_2$), zirconium dioxide ($ZrO_2$), and/or titanium dioxide ($TiO_2$)) with a dielectric constant ($\kappa$) higher than silicon dioxide ($SiO_2$) (e.g., $\kappa=3.9$). In some aspects, the dielectric material may be referred to as a high-$\kappa$ dielectric, which may be abbreviated as "HiK" as depicted in FIG. 4.

Figure 5:
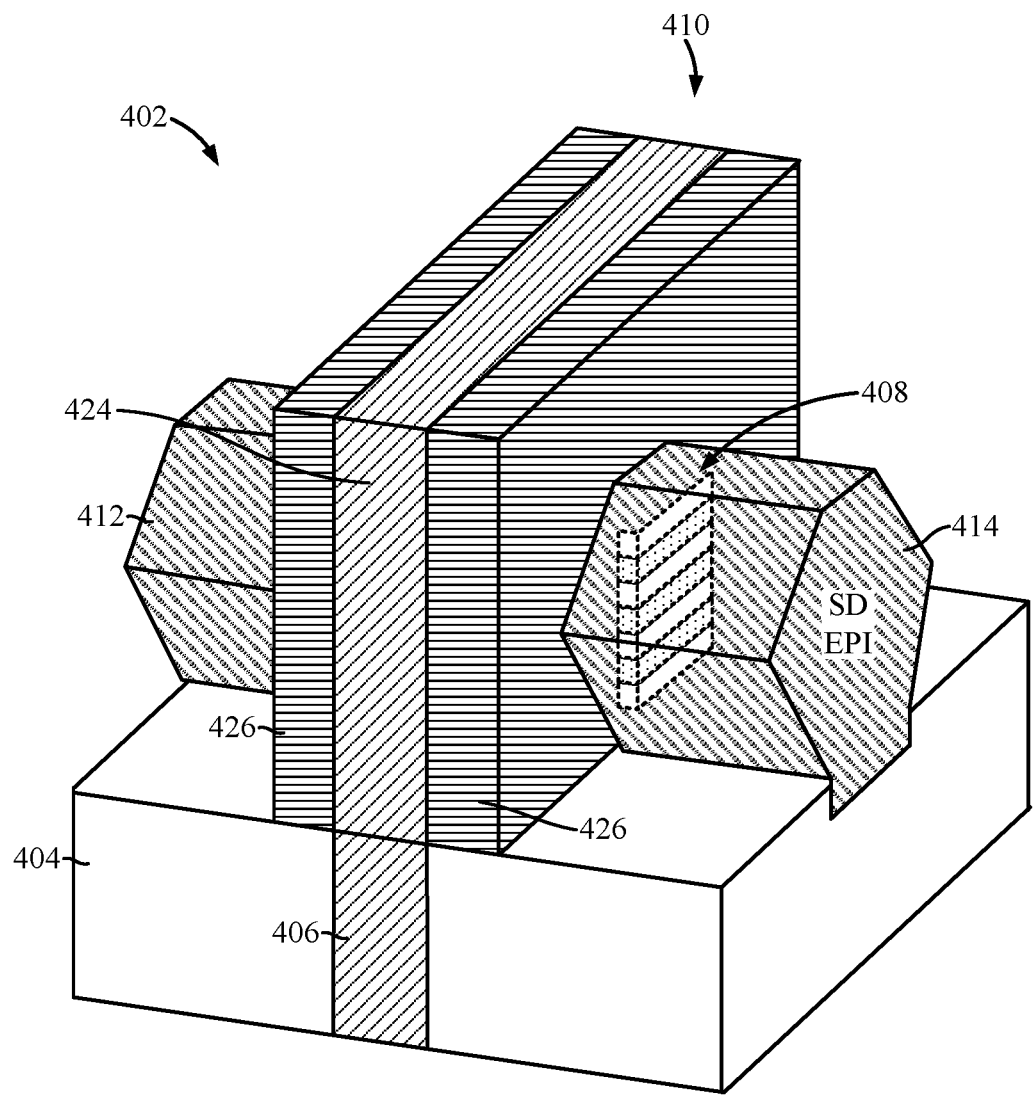
FIG. 5 illustrates an isometric view of an example of the GAA transistor of FIG. 4, in accordance with certain aspects of the present disclosure.

The gate region 410 is disposed around the stack structure 112 as further described herein with respect to FIG. 5. In aspects, the gate region 410 may engage surfaces of the stack structure 408. The gate region 410 may include an electrically conductive material 424 disposed between gate spacers 426, which may serve as a mold in patterning the conductive material 424 around the stack structure 408. In aspects, the conductive material 424 may include various gate electrode materials including tungsten, aluminum, titanium, etc.

The source region 412 may be coupled to a lateral surface of the stack structure 408, and the drain region 414 may be coupled to a second lateral surface of the stack structure 408. In certain aspects, each of the source region 412 and drain region 414 may include a doped (e.g., p+/n+), epitaxially grown semiconductor structure. In aspects, the stack structure 408 is disposed between the source region 412 and drain region 414. In aspects, a dielectric material 428 (e.g., a silicon dioxide) may be disposed between the gate layers 418 and the source and drain regions 412, 414.

In certain aspects, the GAA transistor 402 may be configured as an n-type metal-oxide-semiconductor (NMOS) transistor. For example, the source region 412 and drain region 414 of the GAA transistor 402 may be n+ doped semiconductors. In other aspects, the GAA transistor 402 may be a p-type MOS (PMOS) transistor. For example, the source region 412 and drain region 414 of the GAA transistor 402 may be p+ doped semiconductors.

The substrate 404 may be a portion of, for example, a semiconductor wafer such as a silicon wafer. Frontside dielectric layers 430 may be disposed above the substrate 404, and backside dielectric layers 432 may be disposed below the substrate 404.

The backside gate contact 406 may be an electrically conductive local interconnect disposed below the transistor 402 and coupled to one of the gate layers 418 of the transistor 402. As shown, the backside gate contact 406 is coupled to the bottommost layer of the stack structure 408 and a backside conductive trace 434. The backside gate contact 406 may extend below the substrate 404 and intersect the backside dielectric layers 432. The backside gate contact 406 may enable improved electrical routing approaches of the semiconductor device 400, for example, as described herein with respect to FIG. 1.

While the examples provided herein are described with respect to the stack structure comprising channel layers and gate layers to facilitate understanding, aspects of the present disclosure may also be applied to other suitable GAA structures. For example, the stack structure may be replaced by a gate structure having semiconductor nanowires (e.g., the channels) that intersect the gate structure, which may include various work function metals.

FIG. 5 illustrates an isometric view of the GAA transistor 402 of the semiconductor device 400 depicted in FIG. 4, in accordance with certain aspects of the present disclosure. As shown, the gate region 410 surrounds the stack structure 408. In aspects, the gate region 410 may engage lateral surfaces of the stack structure 408, such that the conductive material 424 of the gate region 410 is electrically coupled to the gate layers of the stack structure 408. The conductive material 424 of the gate region 410 in combination with the gate layers 418 of the stack structure 408 may effectively surround each of the channel layers 416 of the stack structure 408 to facilitate a GAA structure. The source and drain regions 412, 414 may extend laterally from the stack structure 408. In aspects, the source and drain regions 412, 414 may engage the channel layers 416 of the stack structure 408, such that the source and drain regions 412, 414 are electrically coupled to the channel layers 416 of the stack structure 408.

FIGS. 6-12 illustrate example operations for fabricating a semiconductor device, in accordance with certain aspects of the present disclosure. Each of FIGS. 6-12 illustrates a top view, a cross-sectional view along the cross-section AA' of the top view, and another cross-sectional view along the cross-section BB' of the top view. The operations may be performed by a semiconductor fabrication facility, for example. The operations may include various front-end-of-line (FEOL) fabrication processes, when electrical devices (e.g., transistors and capacitive elements) are patterned on a substrate (e.g., the substrate 104), and/or various back-end-of-line (BEOL) fabrication processes, when the electrical devices are electrically interconnected. The operations may also include various layer transfer processes, such as coupling the various backside elements (e.g., dielectric layers and/or conductors) to the substrate of the semiconductor device.

Figure 6:
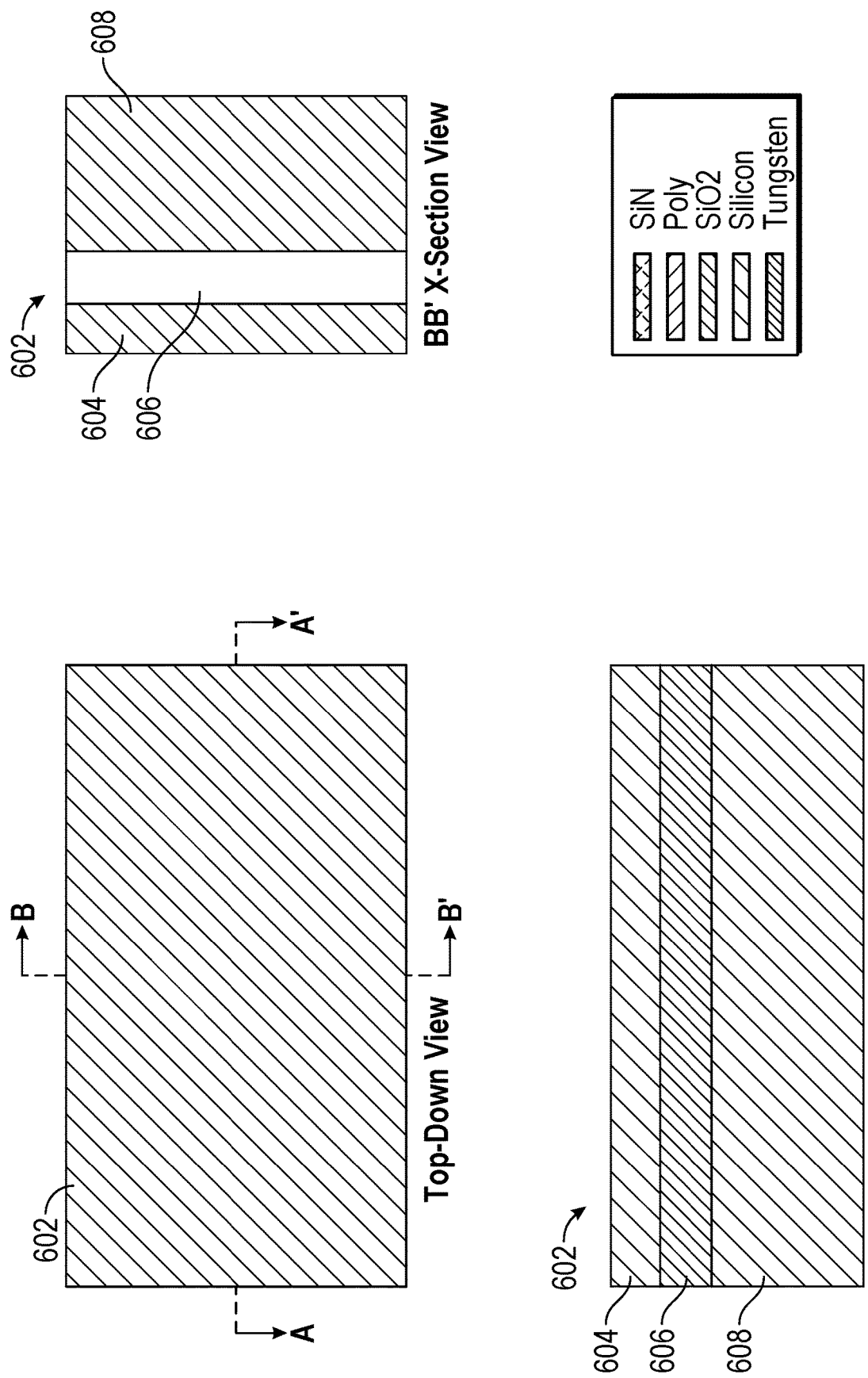
FIGS. 6-12 illustrate various top and cross-sectional views of example operations for fabricating a semiconductor device, in accordance with certain aspects of the present disclosure.

As shown in FIG. 6, a substrate 602 may be formed. The substrate 602 may be a silicon-on-insulator (SOI) substrate having a dielectric layer 606 (e.g., silicon dioxide (Sift)) disposed between a first semiconductor layer 604 and a second semiconductor layer 608. In certain cases, a boule of a semiconductor (e.g., silicon) may be formed and sliced into individual wafers, which may serve as the base material for forming SOI substrates. The substrate 602 may be formed using various methods such as wafer bonding between two silicon substrates, seeding the first semiconductor layer 604 above the dielectric layer 606, or ion beam implantation to form an embedded dielectric layer 606 in a silicon substrate.

Figure 7:
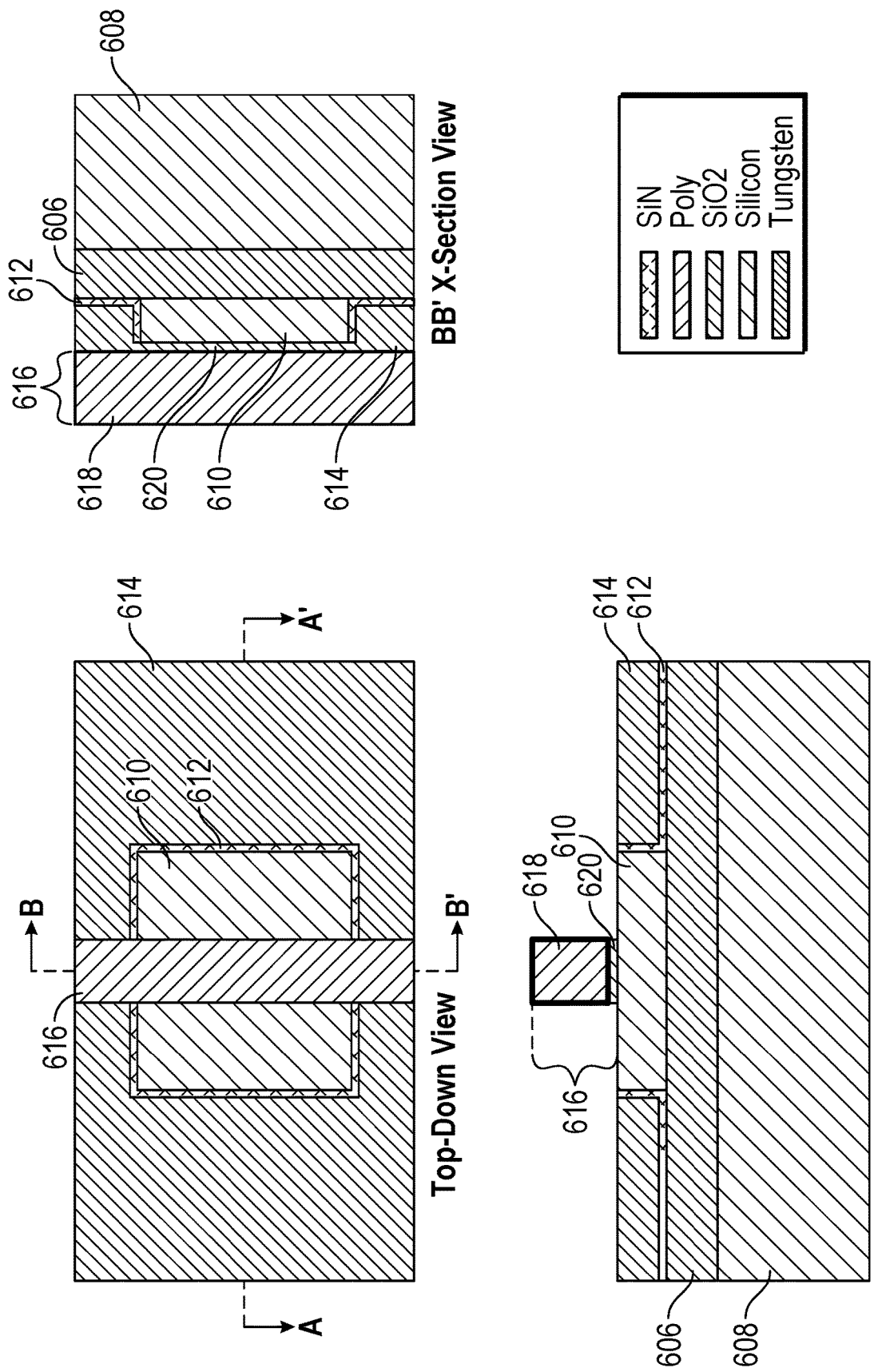

Referring to FIG. 7, a semiconductor region 610 may be formed from the first semiconductor layer 604. In certain cases, a first hard mask layer 612 may be formed above the first dielectric layer 606 and surrounding lateral surfaces of the semiconductor region 610. In aspects, the first hard mask layer 612 may be silicon nitride ($Si_3N_4$). A dielectric region 614 (e.g., silicon dioxide ($SiO_2$)) may be formed above the first hard mask layer 612. A dummy gate region 616 may be formed above a portion of the semiconductor region 610 and a portion of the dielectric region 614. The dummy gate region 616 may include a second dielectric layer 618 and a polycrystalline silicon layer disposed above the second dielectric layer 618. The dummy gate region 616 may serve as a cast for forming a mold of the gate region of a transistor as further described herein.

Figure 8:
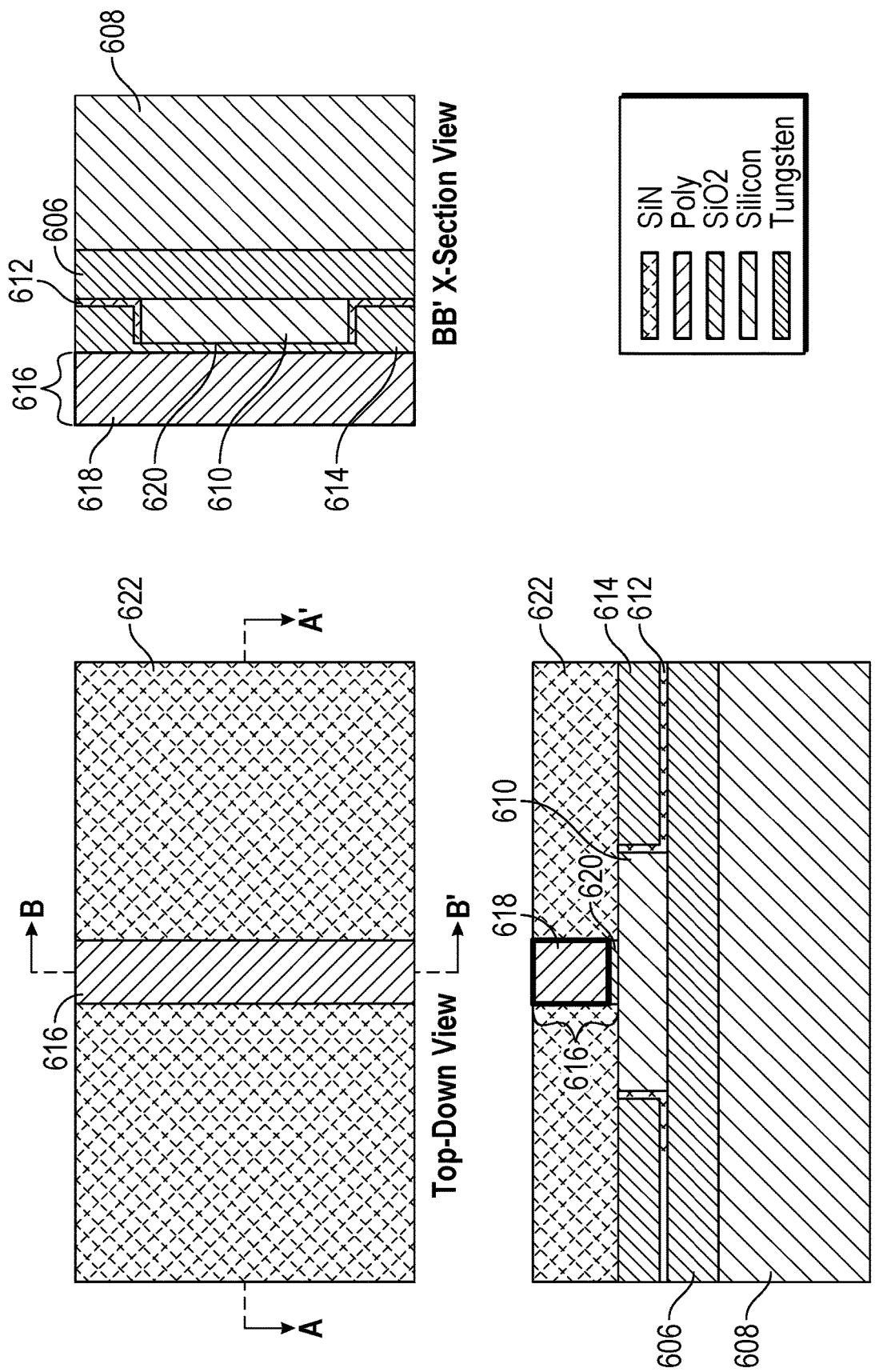

As illustrated in FIG. 8, a second hard mask layer 622 may be formed above the dielectric region 614. In aspects, the second hard mask layer 622 may be silicon nitride ($Si_3N_4$). A planarization process (e.g., a chemical mechanical planarization (CMP) process) may be performed to smooth an upper surface of the second hard mask layer 622 to expose the dummy gate region 616.

Figure 9:
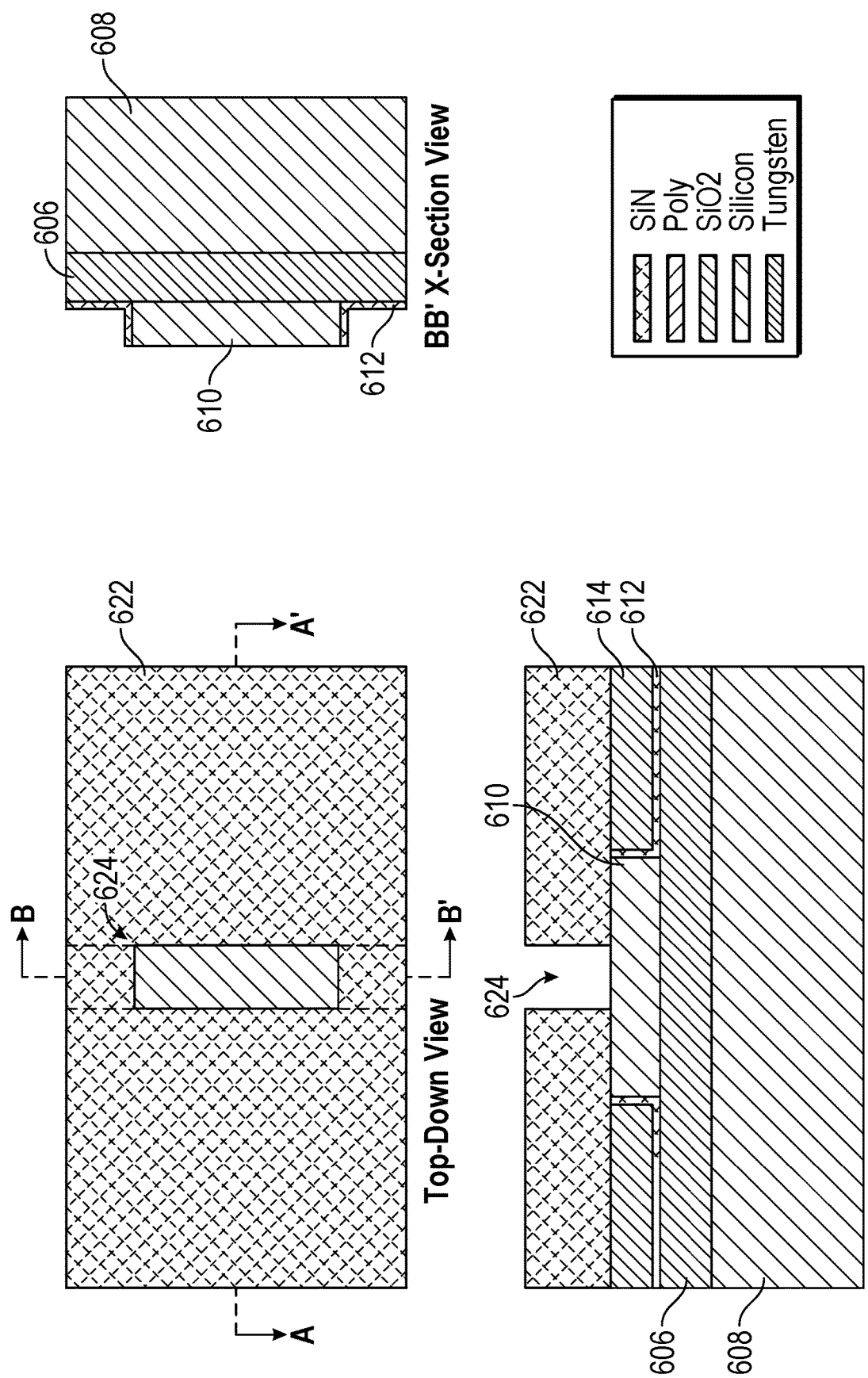

Referring to FIG. 9, the dummy gate region 616 and a portion of the dielectric region 614 may be removed, such that effectively, a cavity 624 is formed in the second hard mask layer 622. The cavity 624 may serve as a mold for the gate region of the transistor. In certain aspects, the dummy gate region 616 and the portion of the dielectric region may be removed using an etching process (e.g., wet etching process and/or dry etching process), and the first and second hard mask layers 612, 622 may serve as the etch-stop barriers for the etching process.

Figure 10:
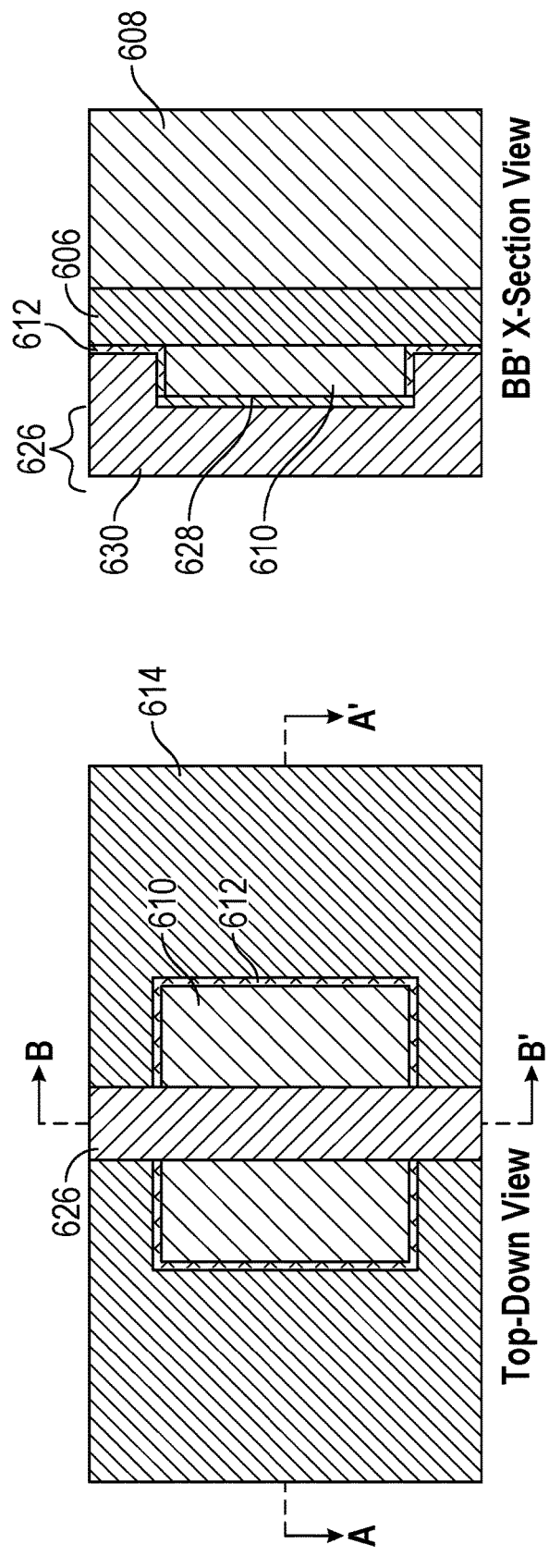

As depicted in FIG. 10, a gate region 626 (e.g., the gate region 120) may be formed in the cavity 624, and the second hard mask layer 622 may be removed. The gate region may wrap around a portion of an upper surface, a portion of a first lateral surface, and a portion of a second lateral surface of the semiconductor region, for example, as described herein with respect to FIGS. 1A and 1B. The gate region 626 may include a conductive layer 630 (e.g., a gate stack) disposed above a third dielectric layer 628 (e.g., a gate oxide such as silicon dioxide). The conductive layer 630 may include one or more layers of electrically conductive materials such as polycrystalline silicon and/or various work function metals including titanium nitride (TiN), aluminum (Al), tantalum nitride (TaN), titanium aluminide (TiAl), tungsten (W), etc. In aspects, the third dielectric layer 628 may include a dielectric material (e.g., hafnium dioxide ($HfO_2$), zirconium dioxide ($ZrO_2$), and/or titanium dioxide ($TiO_2$)) with a dielectric constant ($\kappa$) higher than silicon dioxide ($SiO_2$) (e.g., $\kappa=3.9$).

Figure 11:
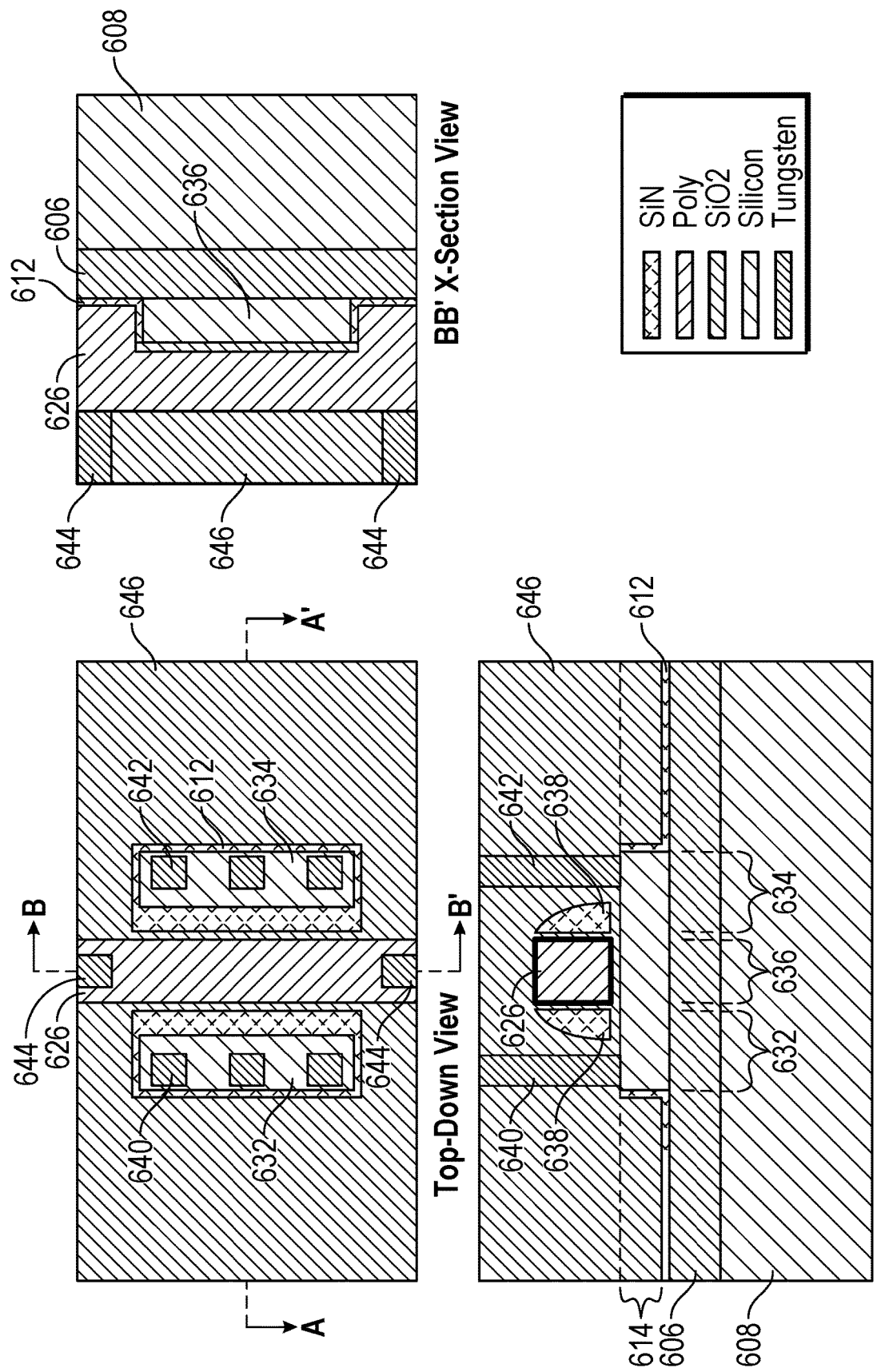

Referring to FIG. 11, a source region 632 (e.g., the source region 124), drain region 634 (e.g., the drain region 126), and channel region 636 (e.g., the channel region 122) may be formed from the semiconductor region 610 disposed above a portion of the substrate 602 (e.g., the first dielectric layer 606). Gate spacers 638 may be formed adjacent to the gate region 626. The gate spacers 638 may enable aligning the doping of the source and drain regions 632, 634. Frontside source contacts 640 may be formed above the source region 632, frontside drain contacts 642 may be formed above the drain region 634, and frontside gate contacts 644 may be formed above the gate region 626. Frontside dielectric layers 646 (e.g., the frontside dielectric layers 110) may be formed above the dielectric region 614, such that the conductive contacts (e.g., the frontside source contacts, frontside drain contacts, and frontside gate contacts) are embedded in the frontside dielectric layers 646.

Figure 12:
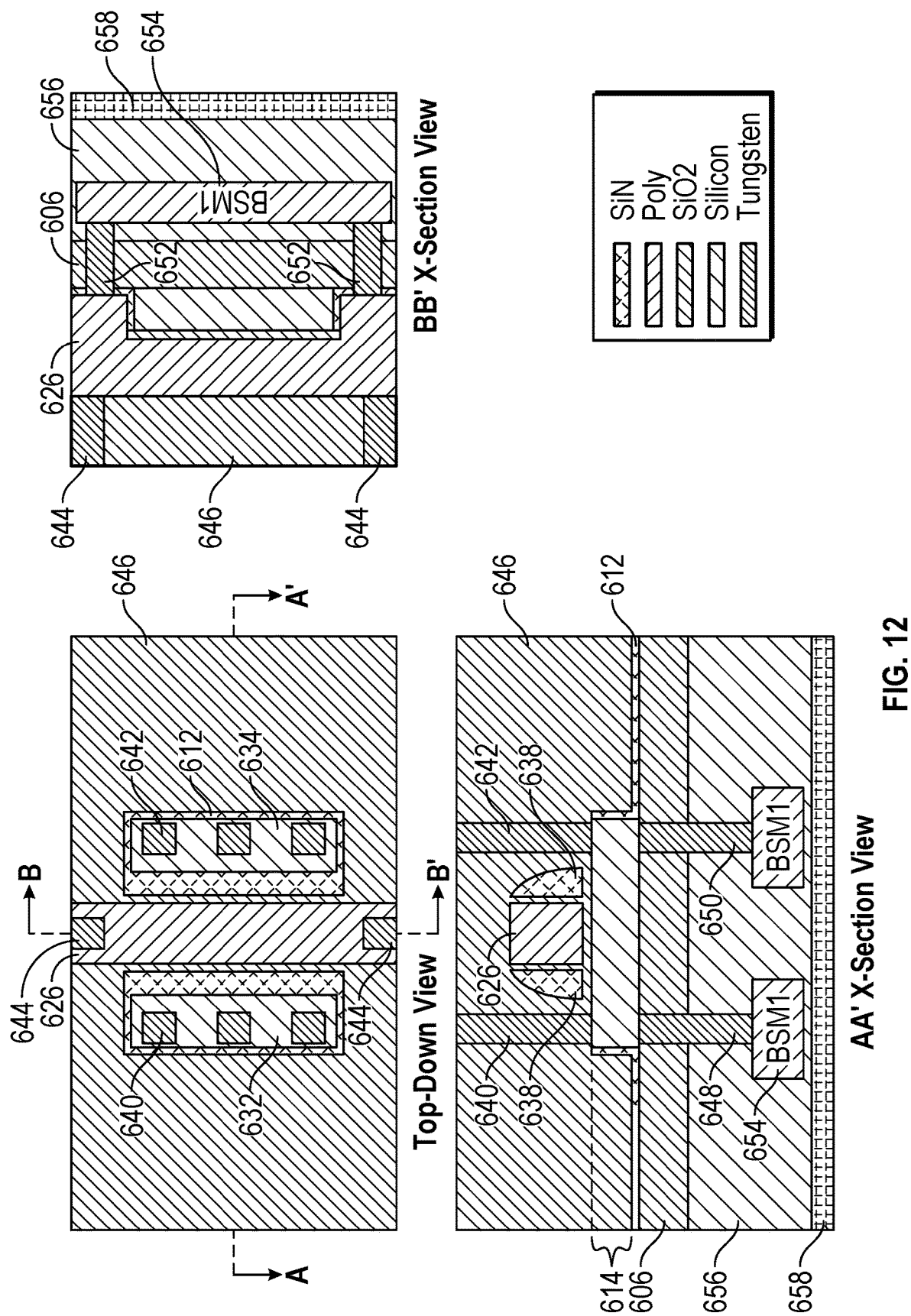

As shown in FIG. 12, backside source contacts 648 may be formed below the source region 632, backside drain contacts 650 may be formed below the drain region 634, and backside gate contacts 652 may be formed below the gate region 626. Backside conductive traces 654 may be formed below the backside gate contacts 652. Backside dielectric layers 656 may be formed below the first dielectric layer 606.

In aspects, the backside elements (contacts, conductive traces, and dielectric layers) may be formed using a layer transfer process. For example, the backside elements may be formed on a separate backside substrate 658 than the substrate (e.g., the substrate 602) on which the transistor is formed, and the dielectric layers of the backside substrate 658 may be bonded to a bottom surface of the transistor substrate, for example, a bottom surface of the first dielectric layer 606.

Figure 13:
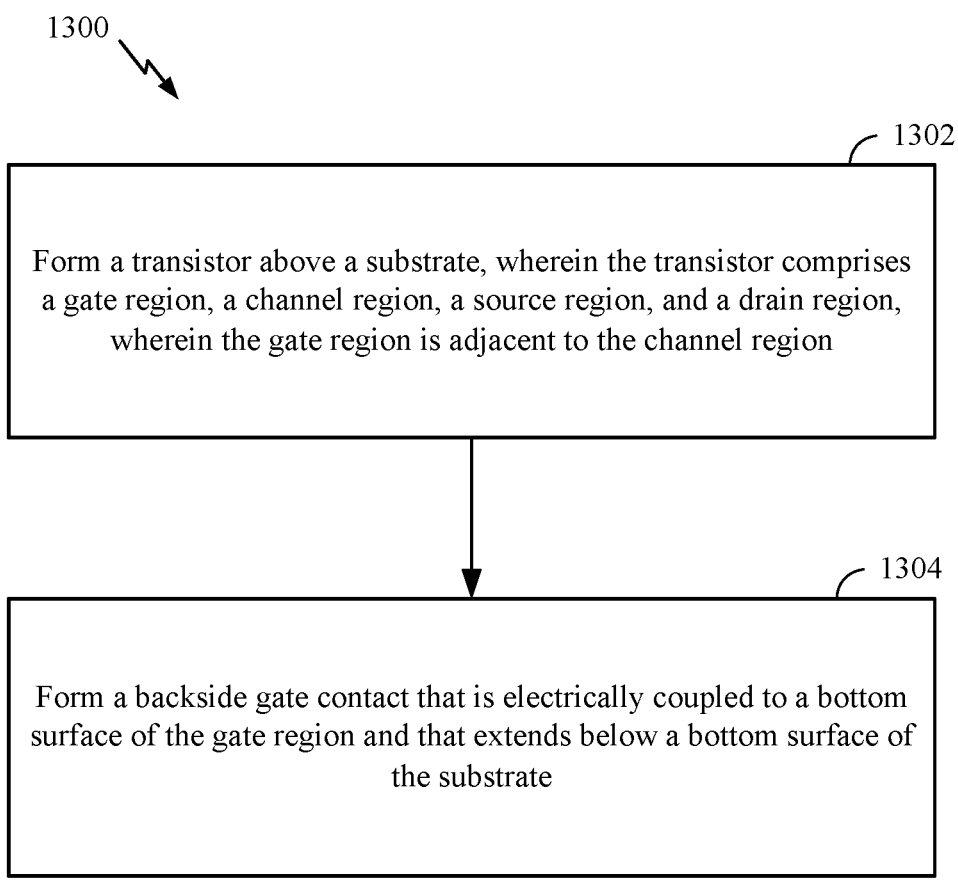
FIG. 13 is a flow diagram of example operations for fabricating a semiconductor device, in accordance with certain aspects of the present disclosure.

FIG. 13 is a flow diagram of example operations 1300 for fabricating a semiconductor device (e.g., the semiconductor device 100 of FIGS. 1A and 1B), in accordance with certain aspects of the present disclosure. The operations 1300 may be performed by an integrated circuit fabrication facility, for example.

The operations 1300 begin, at block 1302, by forming a transistor (e.g., the transistor 102 or GAA transistor 402) above a substrate (e.g., the substrate 104 or the substrate 602). The transistor includes a gate region (e.g., the gate region 120), a channel region (e.g., the channel region 122), a source region (e.g., the source region 124), and a drain region (e.g., the drain region 126). The gate region is adjacent to the channel region. At block 1304, a backside gate contact may be formed below the gate region, such that the backside gate contact is electrically coupled to a bottom surface of the gate region and extends below a bottom surface of the substrate.

In aspects, forming the transistor includes forming the channel region from a semiconductor region (e.g., the first semiconductor layer 604) disposed above the substrate or a portion of the substrate (e.g., the first dielectric layer 606). Forming the transistor at block 1302 further includes forming the gate region, such that the gate region wraps around a portion of an upper surface 140, a portion of a first lateral surface 144, and a portion of a second lateral surface 146 of the channel region 122.

In aspects, forming the backside gate contact at block 1304 includes forming the backside gate contact below the gate region of the transistor. In certain aspects, the backside gate contact (and other backside elements) may be formed via a layer transfer process. In certain cases, forming the backside gate contact includes forming dielectric layers (e.g., the backside dielectric layers 656) above another substrate (e.g., the substrate 658), forming the backside gate contact in the dielectric layers, and coupling the dielectric layers and backside gate contact to the bottom surface of the substrate.

In certain aspects, forming the transistor at block 1302 may include forming the gate region using polycrystalline silicon, for example, as a dummy gate region or as a portion of the gate region. In aspects, the gate region may include a conductive layer (e.g., the conductive layer 630) disposed above a dielectric layer (e.g., the third dielectric layer 628). The conductive layer 630 may include one or more layers of electrically conductive materials such as polycrystalline silicon and/or various work function metals including titanium nitride (TiN), aluminum (Al), tantalum nitride (TaN), titanium aluminide (TiAl), tungsten (W), etc. In aspects, the dielectric layer may include a dielectric material (e.g., hafnium dioxide ($HfO_2$), zirconium dioxide ($ZrO_2$), and/or titanium dioxide ($TiO_2$)) with a dielectric constant ($\kappa$) higher than silicon dioxide ($SiO_2$) (e.g., $\kappa=3.9$).

In aspects, forming the transistor at block 1302 may include forming a finFET or a GAA-FET. For example, forming the transistor may include forming the channel region as a fin structure disposed above the substrate or a portion of the substrate. In certain cases, forming the transistor may include forming the channel region as one or more nanosheets that intersect the gate region, for example, as described herein with respect to FIGS. 4 and 5.

In certain aspects, the operations 1300 may further comprise forming a backside contact (e.g., the backside source or drain contacts 648, 650) electrically coupled to the source region or the drain region, where the backside contact intersects a portion of the substrate.

In aspects, the operations 1300 may further comprise forming a frontside gate contact (e.g., the frontside gate contacts 644) electrically coupled to the gate region and above the gate region.

It should be appreciated that backside gate contacts described herein facilitate improved device design space/options and electrical routing approaches of the semiconductor device.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A semiconductor device comprising:
   a transistor disposed above a substrate, wherein the transistor comprises a gate region, a channel region, a source region, and a drain region, wherein the gate region is disposed adjacent to the channel region, and wherein the gate region comprises:
      a first portion disposed above a portion of an upper surface of the channel region; and
      a second portion extending orthogonally from the first portion and disposed adjacent to a portion of a first lateral surface of the channel region; and
   a backside gate contact that is electrically coupled to a bottom surface of the second portion of the gate region and that extends below a bottom surface of the substrate.

2. The semiconductor device of claim 1, wherein the gate region wraps around the portion of the upper surface, the portion of the first lateral surface, and a portion of a second lateral surface of the channel region.

3. The semiconductor device of claim 2, wherein:
   the gate region further comprises a third portion extending orthogonally from the first portion and disposed adjacent to the portion of the second lateral surface of the channel regio; and
   the backside gate contact is electrically coupled to a bottom surface of the third portion of the gate region.

4. The semiconductor device of claim 1, wherein the gate region comprises polycrystalline silicon.

5. The semiconductor device of claim 1, wherein the transistor is a fin field-effect transistor (finFET).

6. The semiconductor device of claim 1, wherein the channel region includes one or more semiconductor fin structures.

7. The semiconductor device of claim 1, wherein the transistor is a gate-all-around transistor.

8. The semiconductor device of claim 7, wherein the channel region includes one or more nanosheets that intersect the gate region.

9. The semiconductor device of claim 1, further comprising another backside contact electrically coupled to the source region or the drain region, wherein the other backside contact intersects a portion of the substrate and extends below the bottom surface of the substrate.

10. The semiconductor device of claim 1, further comprising a frontside gate contact electrically coupled to the gate region and disposed above the gate region.

11. A method of fabricating a semiconductor device, comprising:
   forming a transistor above a substrate, wherein the transistor comprises a gate region, a channel region, a source region, and a drain region, wherein the gate region is adjacent to the channel region, and wherein the gate region comprises:
      a first portion disposed above a portion of an upper surface of the channel region; and
      a second portion extending orthogonally from the first portion and disposed adjacent to a portion of a first lateral surface of the channel region; and
   forming a backside gate contact that is electrically coupled to a bottom surface of the second portion of the gate region and that extends below a bottom surface of the substrate.

12. The method of claim 11, wherein forming the transistor comprises:
   forming the channel region from a semiconductor region disposed above the substrate; and
   forming the gate region that wraps around the portion of the upper surface, the portion of the first lateral surface, and a portion of a second lateral surface of the channel region.

13. The method of claim 11, wherein forming the backside gate contact comprises forming the backside gate contact below the gate region of the transistor.

14. The method of claim 13, wherein forming the backside gate contact comprises:
   forming dielectric layers above another substrate;
   forming the backside gate contact in the dielectric layers; and
   coupling the dielectric layers and the backside gate contact to the bottom surface of the substrate.

15. The method of claim 11, wherein forming the transistor comprises forming the gate region using polycrystalline silicon.

16. The method of claim 11, wherein forming the transistor comprises forming a fin field-effect transistor (finFET).

17. The method of claim 11, wherein forming the transistor comprises forming the channel region as a fin structure disposed above the substrate.

18. The method of claim 11, wherein forming the transistor comprises forming a gate-all-around transistor.

19. The method of claim 11, wherein forming the transistor comprises forming the channel region as one or more nanosheets that intersect the gate region.

20. The method of claim 11, further comprising forming another backside contact electrically coupled to the source region or the drain region, wherein the other backside contact intersects a portion of the substrate.

* * * * *